(12) United States Patent
Gontin et al.

(10) Patent No.: US 7,411,687 B2
(45) Date of Patent: *Aug. 12, 2008

(54) SPECKLE REDUCTION METHOD AND SYSTEM FOR EUV INTERFEROMETRY

(75) Inventors: Richard A. Gontin, Rye, NY (US); Yuli Vladimirsky, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 94 days.

This patent is subject to a terminal disclaimer.

(21) Appl. No.: 11/391,378

(22) Filed: Mar. 29, 2006

(65) Prior Publication Data

US 2006/0256349 A1 Nov. 16, 2006

Related U.S. Application Data

(63) Continuation of application No. 10/651,049, filed on Aug. 29, 2003, now Pat. No. 7,027,164.

(60) Provisional application No. 60/440,053, filed on Jan. 15, 2003, provisional application No. 60/440,051, filed on Jan. 15, 2003, provisional application No. 60/440,050, filed on Jan. 15, 2003.

(51) Int. Cl.
*G01B 9/02* (2006.01)
(52) U.S. Cl. ..................................... 356/521
(58) Field of Classification Search .......... 356/512, 356/521

See application file for complete search history.

(56) References Cited

U.S. PATENT DOCUMENTS

| 4,413,909 A | 11/1983 | Pohle |
| 4,490,608 A * | 12/1984 | Yeadon et al. .............. 250/235 |
| 5,222,050 A | 6/1993 | Marren et al. |
| 5,424,552 A | 6/1995 | Tsuji et al. |
| 5,486,950 A | 1/1996 | Collinge |
| 5,641,593 A | 6/1997 | Watanabe et al. |
| 5,715,039 A | 2/1998 | Fukuda et al. |
| 5,835,217 A * | 11/1998 | Medecki ..................... 356/521 |

(Continued)

FOREIGN PATENT DOCUMENTS

EP  1 106 972 A1  6/2001

(Continued)

OTHER PUBLICATIONS

Bjorkholm, J. E., "EUV Lithography—The Successor to Optical Lithography?", Intel Technology Journal Q3'98, 1998, pp. 1-8.

(Continued)

*Primary Examiner*—Patrick Connolly
*Assistant Examiner*—Jonathan Skovholt
(74) *Attorney, Agent, or Firm*—Sterne, Kessler, Goldstein & Fox PLLC

(57) ABSTRACT

A wavefront measurement system has a source of electromagnetic radiation. An imaging system focuses the electromagnetic radiation at an object plane. A first grating is positioned in the object plane and has a plurality of rulings with randomized height. A stage moves the first grating parallel to the rulings. A projection optical system projects an image of the first grating onto an image plane. A second grating is at the image plane. A detector behind the second grating receives a fringe pattern produced by the second grating.

9 Claims, 6 Drawing Sheets

U.S. PATENT DOCUMENTS

| | | | |
|---|---|---|---|
| 5,958,629 | A | 9/1999 | Yan et al. |
| 6,057,082 | A | 5/2000 | Korth |
| 6,072,631 | A | 6/2000 | Guenther et al. |
| 6,163,405 | A | 12/2000 | Chang et al. |
| 6,360,012 | B1 | 3/2002 | Kreuzer |
| 6,373,553 | B1 | 4/2002 | Singh |
| 6,392,792 | B1 | 5/2002 | Naulleau |
| 6,506,526 | B2 | 1/2003 | Stivers et al. |
| 6,573,997 | B1 * | 6/2003 | Goldberg et al. ............ 356/521 |
| 6,650,399 | B2 | 11/2003 | Baselmans et al. |
| 6,686,098 | B2 | 2/2004 | Czech et al. |
| 6,867,846 | B2 | 3/2005 | Poultney |
| 6,898,216 | B1 | 5/2005 | Kleinschmidt |
| 7,002,747 | B2 | 2/2006 | Augustyn et al. |
| 7,027,164 | B2 | 4/2006 | Gontin et al. |
| 7,164,534 | B2 | 1/2007 | Augustyn et al. |
| 7,268,891 | B2 | 9/2007 | Poultney |
| 2001/0028462 | A1 | 10/2001 | Ichihara et al. |
| 2001/0051304 | A1 | 12/2001 | Stivers et al. |
| 2002/0122162 | A1 | 9/2002 | Nakauchi et al. |
| 2003/0081316 | A1 | 5/2003 | Goldberg et al. |

FOREIGN PATENT DOCUMENTS

| | | |
|---|---|---|
| EP | 1 197 803 A2 | 4/2002 |
| EP | 1 197 803 A3 | 4/2002 |
| EP | 1 231 514 A1 | 8/2002 |
| EP | 1 237 041 A2 | 9/2002 |
| EP | 1 237 041 A3 | 9/2002 |
| JP | 3134538 | 6/1991 |
| JP | 2000-266914 | 9/2000 |
| JP | 2001-60550 A | 3/2001 |
| JP | 2002-334831 | 11/2002 |
| JP | 2003-524175 T | 8/2003 |
| WO | WO 02/42728 A1 | 5/2002 |

OTHER PUBLICATIONS

Goldberg, K.A., et al., "Extreme ultraviolet interferometry: at-wavelength testing of optics for lithography," The Advanced Light Source, 1998, at http://www-als.lbl.gov/als/compendium/AbstractManager/uploads/ACF4B6D.pdf, 4 pages.

Goldberg, K.A., et al., "Extreme ultraviolet interferometry: measuring EUV optical systems with sub-Å accuracy," The Advanced Light Source, 2001, at http://www-als.lbl.gov/als/compendium/AbstractManager/uploads/01125.pdf, 3 pages.

Kolb, R., "EUV Lithography Making Possible Next Generation of Semiconductors," Sciencebeat [online], Jun. 5, 2001, at http://www.lbl.gov/Science-Articles/Archive/euv_milestone.html (visited Jan. 12, 2003), 4 pages.

Lee, S. H., *High Accuracy EUV Interferometry*, at http://buffy.eecs.berkeley.edu/IRO/Summary/99abstracts/shlee.1.html (visited Jan. 12, 2003), 1 page.

Mansuripur, M., "The Ronchi Test," MM Research, Inc., at http://www.mmresearch.com/articles/article1 (visited Jan. 9, 2003), 12 pages (also published in *Optics & Photonics News*, Jul. 1997, pp. 42-46).

*Measurement Science in the Extreme Ultraviolet: Testing Advance Optics for Printing Integrated Circuits*, at http://www.als.lbl.gov/als/actrep/FileH.pdf (visited Jan. 12, 2003), 2 pages.

Naulleau, P. P., et al., "Fabrication of high-efficiency multilayer-coated binary blazed gratings in the EUV regime," *Optics Communications*, vol. 200, Dec. 15, 2001, Elsevier Science B.V., pp. 27-34.

Wyant, J. C., "White Light Extended Source Shearing Interferometer," *Applied Optics*, vol. 13, No. 1, Jan. 1974, pp. 200-202.

Search Report from the European Patent Office for European Patent Application No. 04000512.6-2217, mailed Jan. 3, 2005 (3 pages).

Search Report from the Danish Patent and Trademark Office for Singapore Patent Application No. 2004001 12-9, mailed Aug. 20, 2004 (7 pages).

English-language abstract for Japanese Patent Application No. 2000-266914, published Sep. 29, 2000, from www.espacenet.com, 1 page.

Search Report for Singapore Application No. 200400111-1, issued on Jun. 5, 2004.

Translation of Office Action and Office Action for Japanese Patent Application No. 2004-248803 mailed Feb. 13, 2008, 7 pgs.

Office Action for Japanese Patent Application No. 2004-248803 dated Sep. 28, 2007, 4 pages.

* cited by examiner

SPECKLE REDUCTION METHOD AND SYSTEM FOR EUV INTERFEROMETRY

CROSS-REFERENCE TO RELATED APPLICATIONS

This application is a continuation of U.S. patent application Ser. No. 10/651,049 Filed Aug. 29, 2003, Titled: SPECKLE REDUCTION METHOD AND SYSTEM FOR EUV INTERFEROMETRY, now U.S. Pat. No. 7,027,164, which claims priority to U.S. Provisional Patent Application No. 60/440,053 Filed: Jan. 15, 2003, Titled: DIFFUSER PLATE AND METHOD OF MAKING SAME, U.S. Provisional Patent Application No. 60/440,051 Filed: Jan. 15, 2003, Titled: TAILORED REFLECTING DIFFRACTOR FOR EUV LITHOGRAPHIC SYSTEM ABERRATION MEASUREMENT, U.S. Provisional Patent Application No. 60/440,050 Filed: Jan. 15, 2003, Titled: TRANSMISSION SHEAR GRATING IN CHECKERBOARD CONFIGURATION FOR EUV WAVEFRONT SENSOR, which are all incorporated by reference herein.

BACKGROUND OF THE INVENTION

1. Field of the Invention

The present invention is generally related to extreme ultraviolet (EUV) photolithography systems, and more particularly, to measuring wavefront parameters in a photolithographic system.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage (WS), is exposed to an image projected onto the surface of the wafer by an exposure system located within a lithography system. The exposure system includes a reticle (also called a mask) for projecting the image onto the wafer.

The reticle is usually mounted on a reticle stage (RS) and generally located between the wafer and a light source. In photolithography, the reticle is used as a photo mask for printing a circuit on the wafer, for example. Lithography light shines through the mask and then through a series of optical lenses that shrink the image. This small image is then projected onto the wafer. The process is similar to how a camera bends light to form an image on film. The light plays an integral role in the lithographic process. For example, in the manufacture of microprocessors (also known as computer chips), the key to creating more powerful microprocessors is the size of the light's wavelength. The shorter the wavelength, the more transistors can be formed on the wafer. A wafer with many transistors results in a more powerful, faster microprocessor.

As chip manufacturers have been able to use shorter wavelengths of light, they have encountered a problem of the shorter wavelength light becoming absorbed by the glass lenses that are intended to focus the light. Due to the absorption of the shorter wavelength light, the light fails to reach the silicon wafer. As a result, no circuit pattern is created on the silicon wafer. In an attempt to overcome this problem, chip manufacturers developed a lithography process known as Extreme Ultraviolet Lithography (EUVL). In this process, a glass lenses can be replaced by a mirror.

The problem of measuring the quality of the illumination beam is a persistent one for the lithographic applications. In particular, it is desirable to be able to measure wavefront quality in the photolithographic tool during wafer production and exposure, rather than having to take the tool offline in order to do so, which increases cost of ownership, reduces through-put or introduces some other type of inefficiency.

SUMMARY OF THE INVENTION

The present invention is directed to a transmission shear grating of checkerboard configuration for an EUV wavefront sensor that substantially obviates one or more of the problems and disadvantages of the related art.

An embodiment of the present invention includes a wavefront measurement system that has a source of electromagnetic radiation. An imaging system focuses the electromagnetic radiation at an object plane. A first grating is positioned in the object plane and has a plurality of reflective rulings with randomized height. A stage moves the first grating parallel to the rulings. A projection optical system projects an image of the first grating onto an image (wafer) plane. A second grating is at the image plane. A detector behind (or below, or after) the second grating receives a fringe pattern produced by the second grating.

In another embodiment, a method of measuring a wavefront of an optical system includes: (1) generating electromagnetic radiation at a source; (2) focusing the electromagnetic radiation at an object plane of the optical system; (3) positioning a first grating in an optical path of the optical system that conditions the electromagnetic radiation at the object plane, the first grating including a plurality of rulings; (4) conjugating an image plane and the object plane; (5) positioning a detector below the image plane and a second grating at the image plane; (6) receiving the image of the source through the second grating while simultaneously moving the first grating parallel to the rulings; and (7) calculating wavefront parameters from the image.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

Figure 1:
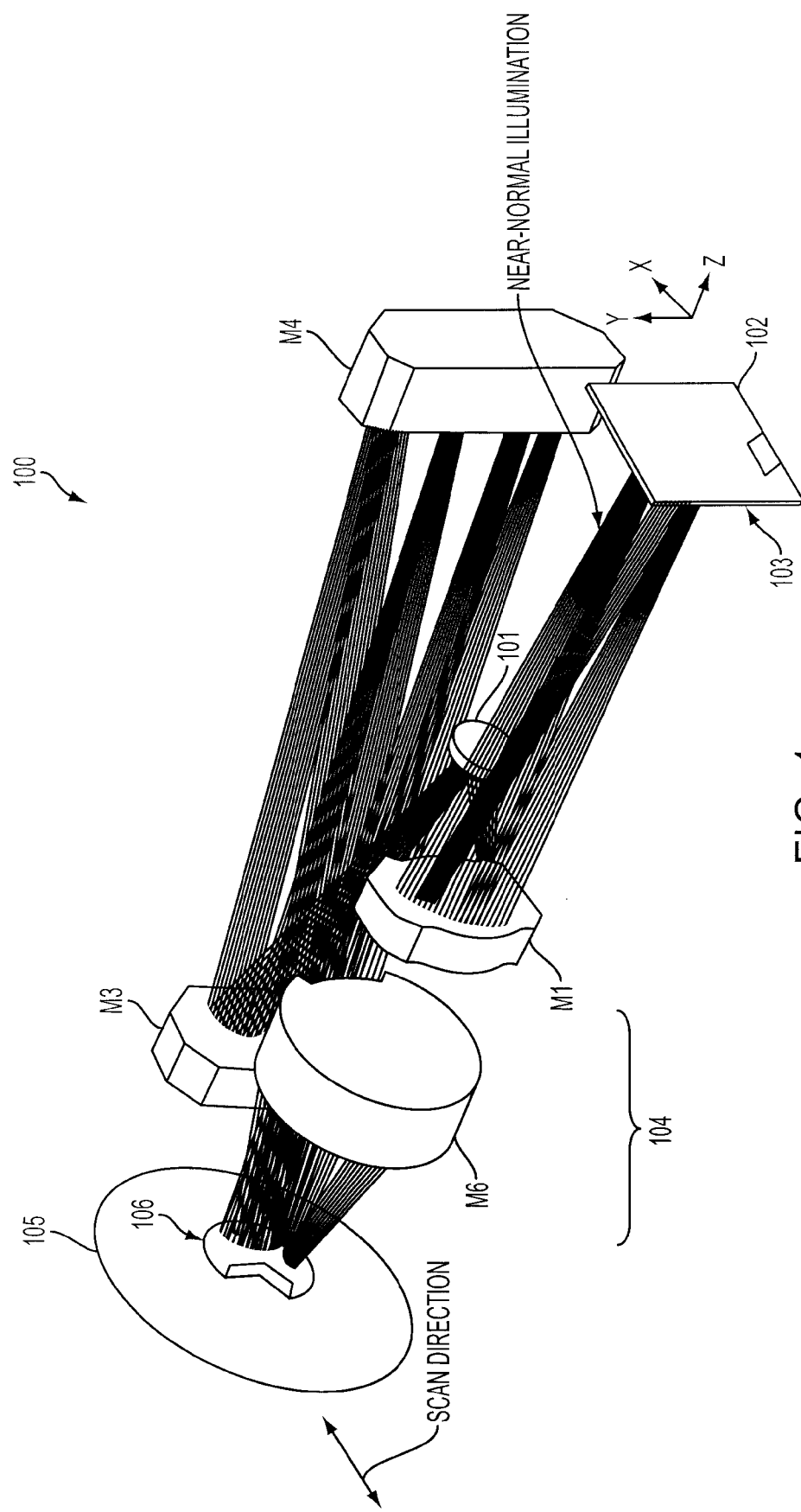
FIG. 1 shows a portion of an EUV photolithographic system.

FIG. 1 illustrates a portion of an EUV photolithographic system 100, which includes an EUV source (not shown in FIG. 1). The system 100 also includes image optics (including mirrors M4 and M3), a pupil 101, a reflective reticle 102 mounted on a reticle stage (RS, not shown) with an image of a pattern to be imaged onto a wafer 105, and projection optics (PO) 104 mirrors M1 and M6. The EUV radiation is then projected onto a wafer 105, which is mounted on a wafer stage (WS, not shown). It will be appreciated that the reticle 102 is reflective in EUV systems, unlike photolithographic systems operating at longer wavelengths, such as deep ultraviolet, or visible, where the reticle 102 is usually transmissive, although the invention is applicable to both types of reticles.

As further shown in FIG. 1, in the present invention, a sensor module 106 is placed on the wafer stage, and a source module 103 is placed on the reticle stage, to measure the wavefront. The sensor 106 and the source module 103 are collectively referred to as a wavefront sensor (WFS).

Figure 2:
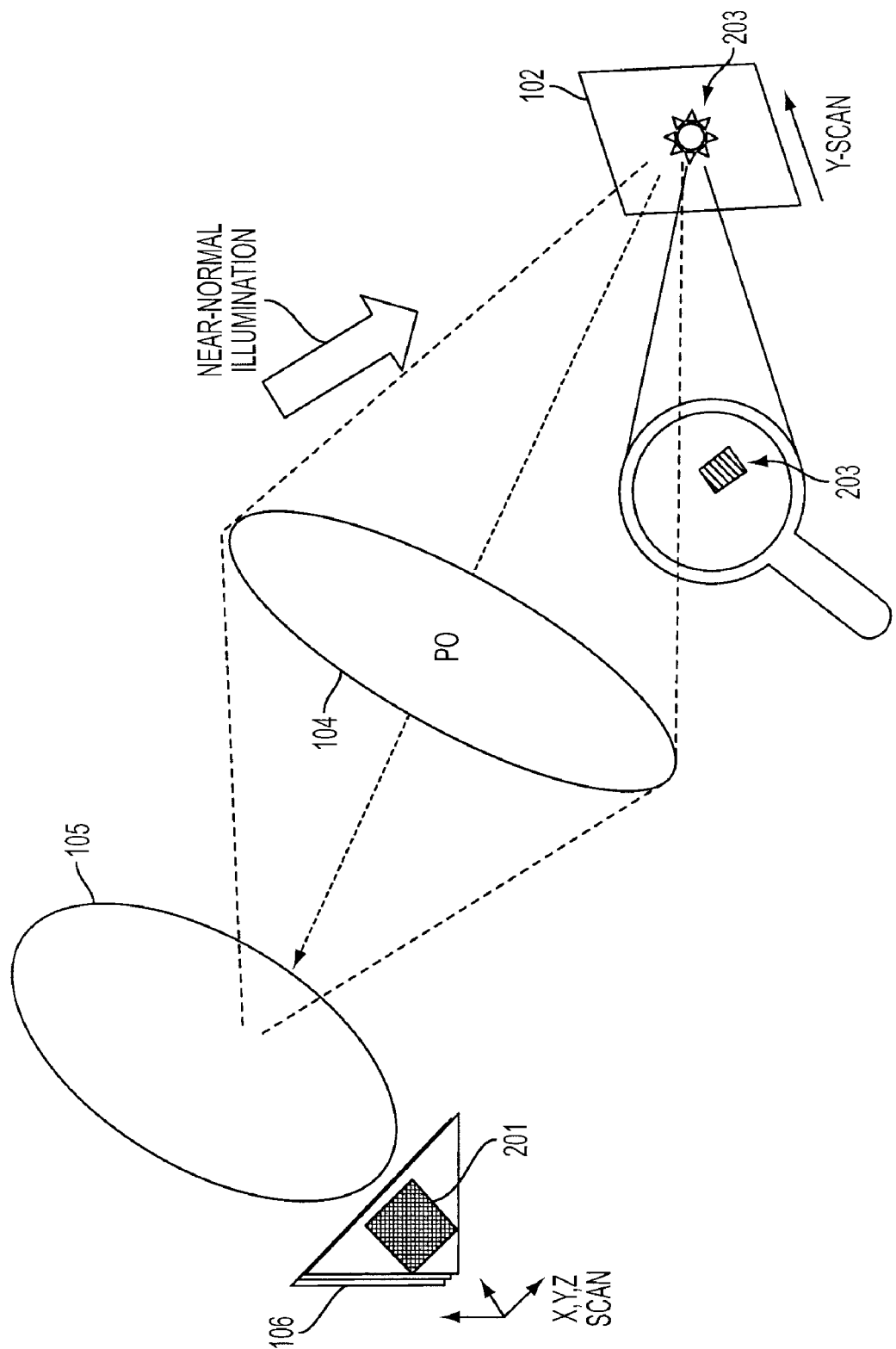
FIG. 2 shows an illustration of how a sensor module and a source module of the present invention fit within the photolithographic system.

FIG. 2 is another illustration of the wavefront measurement apparatus of the present invention, particularly as it can be incorporated into a photolithographic system. The source module 103 is placed on the reticle stage (not shown), and includes a linear source module grating 203. The wavefront sensor (or sensor module 106) is placed on the wafer stage not shown and includes a sensor module grating 201 (which may be a linear grating or a 2-D checkerboard grating) and a CCD detector 202 that is positioned below the sensor module grating 201. The projection optics (PO) 104 remain the same as during normal exposure operation, and are abstracted as a single element in FIG. 2 to simplify the figure.

The wavefront can be measured when imaging is not being performed. In order to measure the wavefront, the reticle stage is moved, such that one of the gratings 203 in the source module 103 on the reticle stage is placed in the optical path, rather than the reticle 102 itself. The wafer stage is also moved such that the wavefront sensor is positioned to receive an image of the source module grating 203. The CCD detector 202 below the sensor module grating 201 then detects the transmitted radiation. The reticle stage can then be moved to place a different diffraction grating in the optical path, so as to enable measurement of the wavefront with an orthogonal orientation of the source module grating 203.

The sensor module grating 201 includes both transmissive and opaque regions. The opaque regions can be formed of materials that absorb EUV radiation (this case, for 13.5 nm exposure wavelength), such as nickel, chromium or other metals.

One of ordinary skill in the art will also appreciate that some of the tolerancing concerns between the sensor module 106 and the source module 103 can be resolved by first fabricating the sensor module grating 201, measuring its exact dimensions, and then fabricating the source module grating 203 accordingly. This reduces the need for extreme precision in the manufacture of both sets of gratings simultaneously.

Another embodiment of the sensor module grating 201 is a cross grating, such that two linear gratings of an appropriate pitch are essentially placed one on top of another, with each grating having the appropriate pitch dimension to result in a wavefront shear equivalent to that of the checkerboard configuration. It is believed, however, that the checkerboard grating gives best results.

It will also be appreciated that although the discussion above is primarily in terms of a EUV photolithography system, where reflective optical elements are typically used (such as the source module grating 203, the projection optics 104, and the imaging optics), the invention is equally applicable to other wavelengths used in the photolithographic system, with appropriate transmissive/refractive components used in place of reflective ones, as appropriate.

The pitch of the source module grating 203 is also chosen to make interference between plus and minus first order images disappear.

Figure 3:
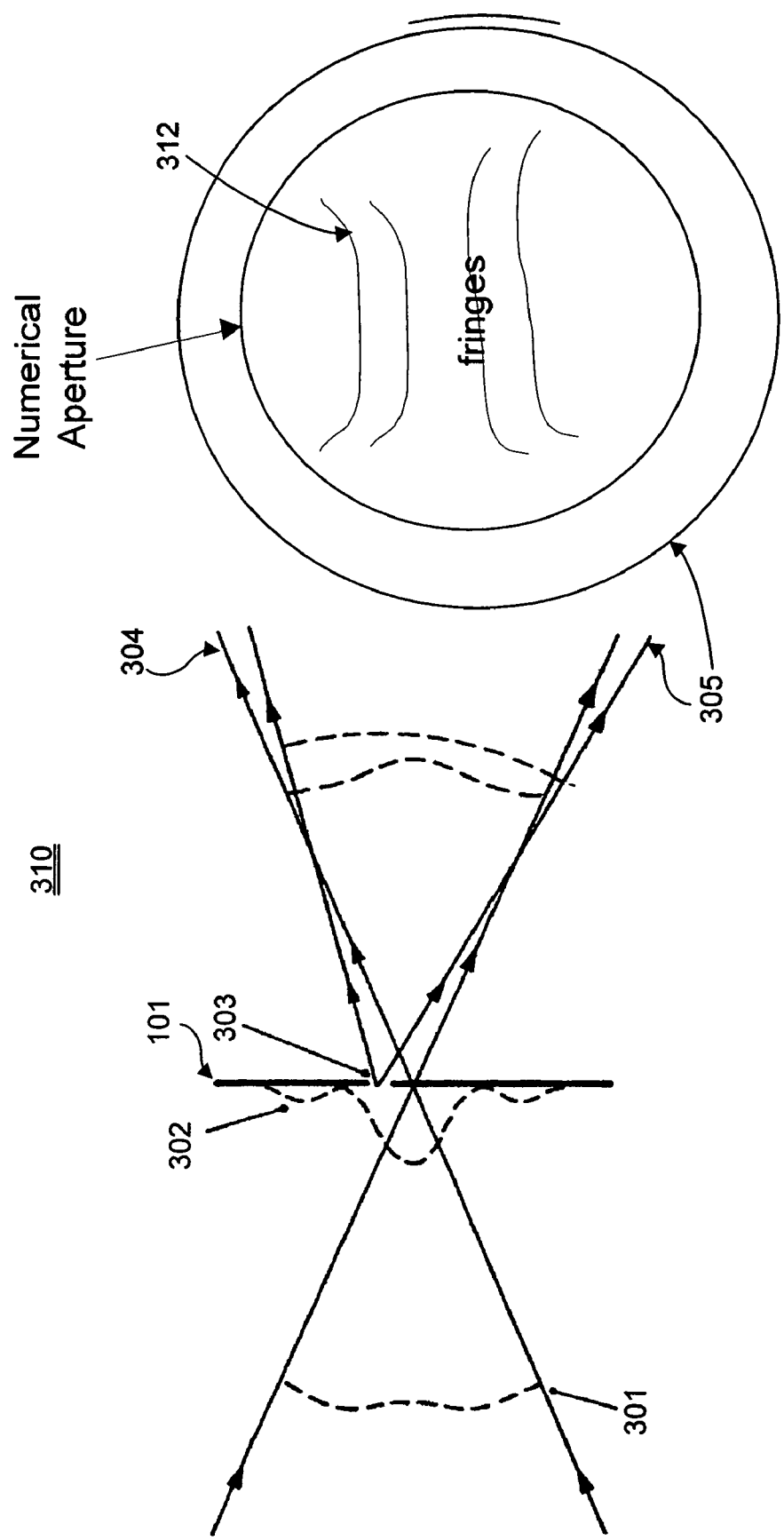
FIGS. 3 and 4 illustrate the use of an interferometer to produce shear wavefronts.
Figure 4:
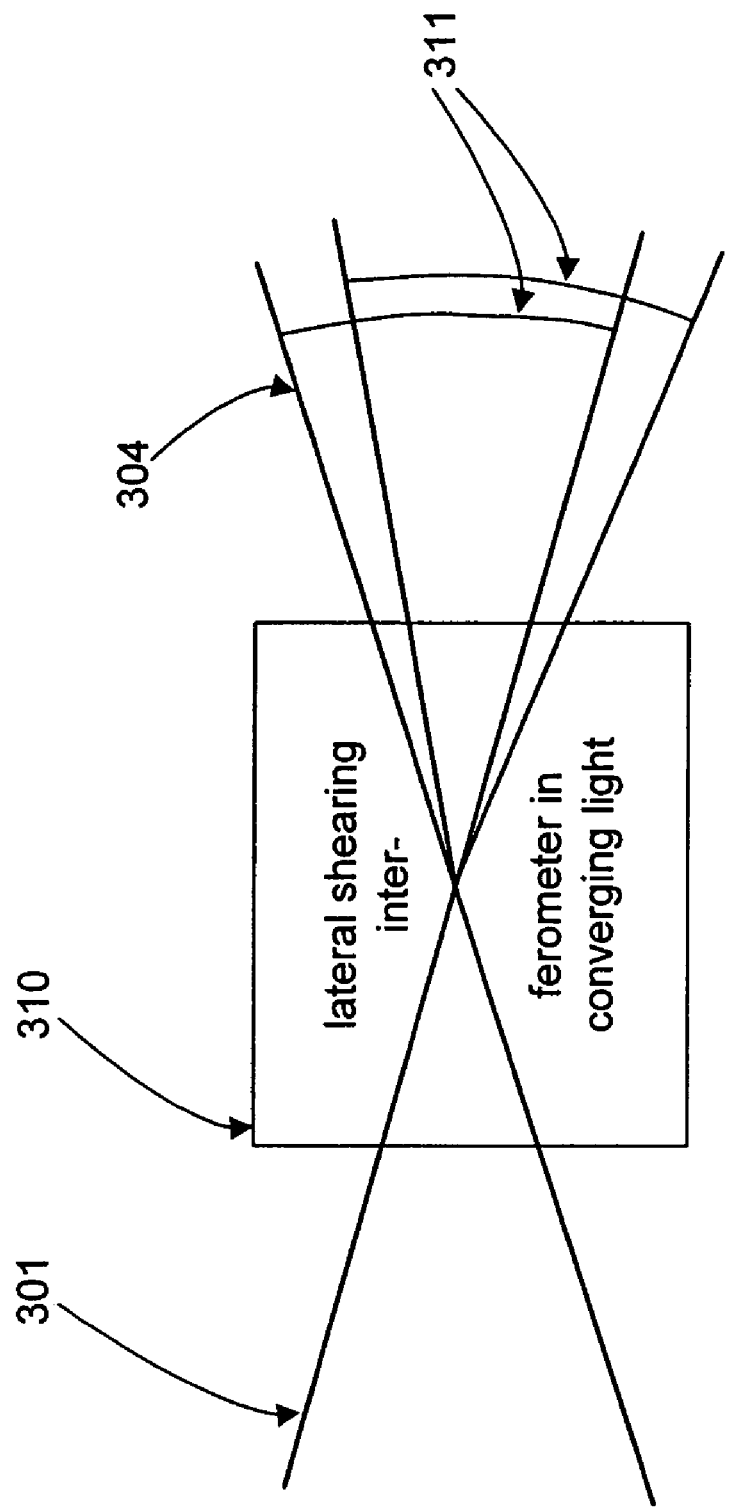

FIGS. 3 and 4 illustrate the use of a pupil in a lateral shearing interferometer 310 to produce reference wavefronts and shear wavefronts. (See also the entrance pupil 101 in FIG. 1). As shown in FIGS. 3 and 4, a wavefront 301 converges at a point in space, while emanating from a primary source. An image of a point source 302 exists at an entrance pupil 101. A partially transmitting film may be placed at the entrance pupil 101. A pinhole 303 is positioned at the entrance pupil 101. The pinhole 303 generates a transmitted wave 304 with a wavefront 311, which includes a diffracted spherical reference wave 305. Thus, the lateral shearing interferometer 310 creates one or more apparent sources, whose wavefronts 311 interfere to produce fringes 312.

Figure 5:
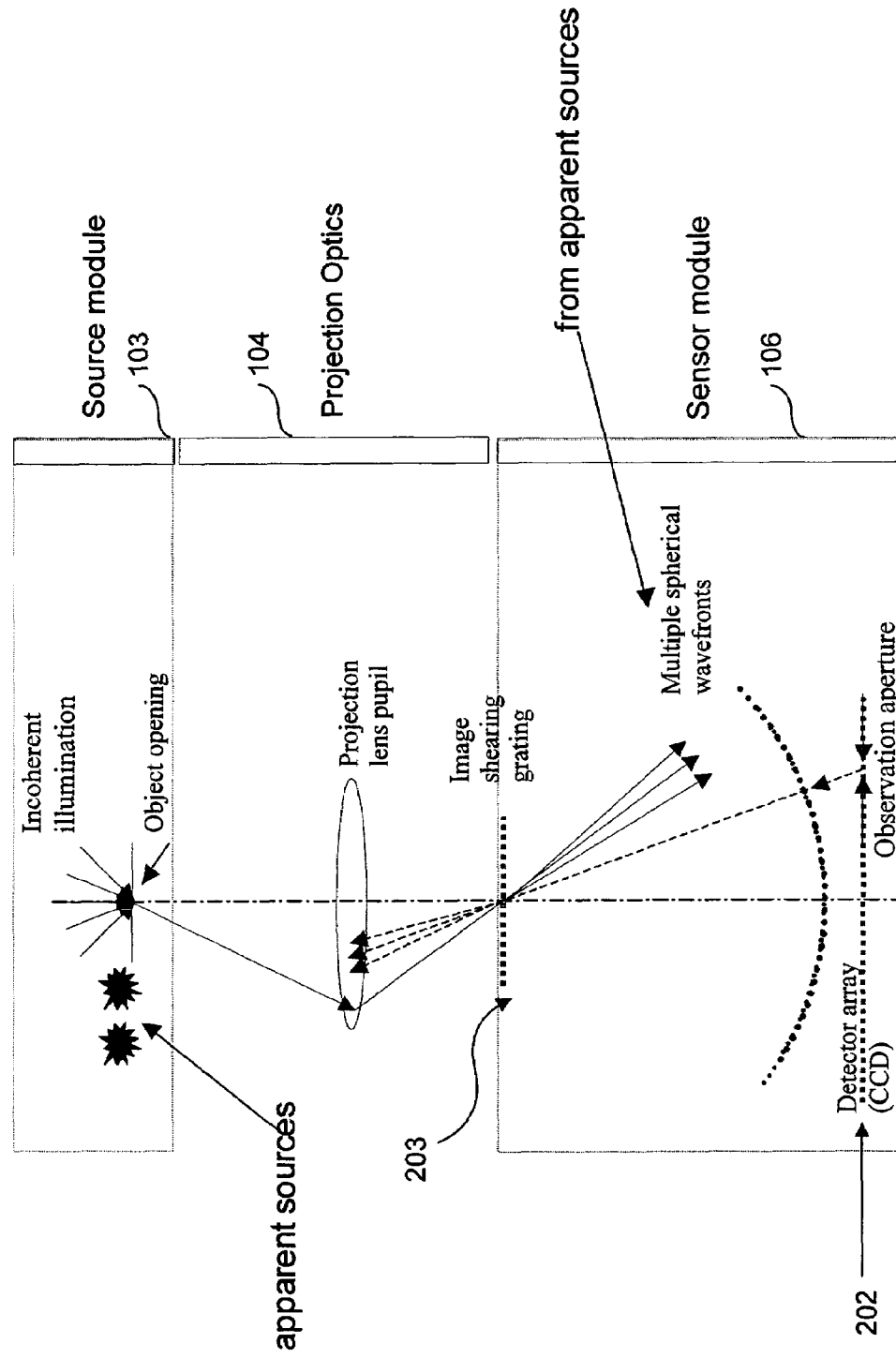
FIG. 5 is another schematic illustrating the present invention as used within a photolithographic tool.

FIG. 5 is another illustration of the wavefront measurement system of the present invention, showing the source module 103 positioned in the object plane (reticle 102 plane, not labeled in the figures) and the projection optics 104. An image shearing grating 203 positioned on the reticle stage, and generates multiple wavefronts that are then detected in the sensor module 106.

Figure 6:
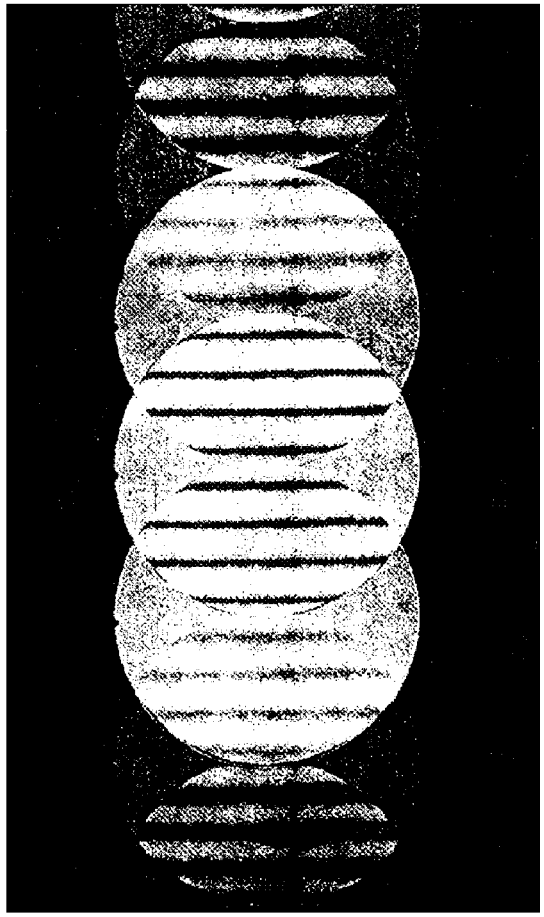
FIG. 6 illustrates an example of interference fringes as they appear at the focal plane with the use of the present invention.
Figure 6:
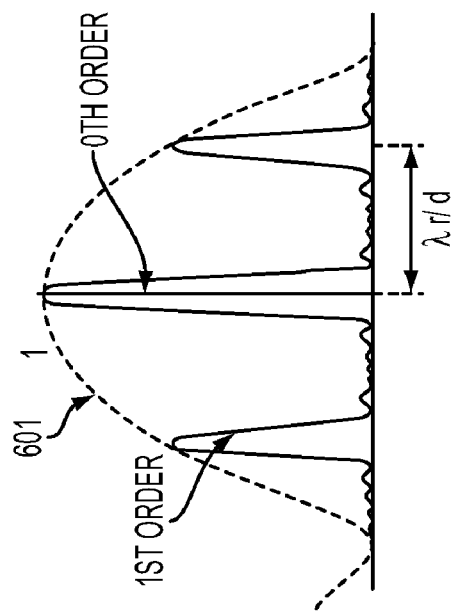
Figure 6:
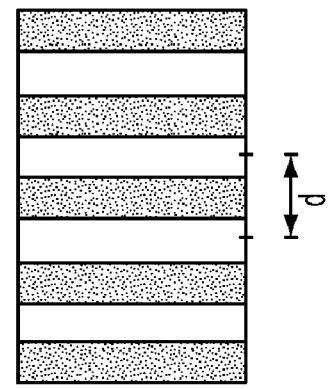

FIG. 6 illustrates the wavefront fringes (312 in FIG. 3) as seen by the CCD detector 203. As shown in FIG. 6, in the upper right-hand photograph, sheared fringes for a single object space slit are shown, where the slit is positioned in front of an incoherent, diffuse source that fills the maximum numerical aperture and smoothes any wavefront inhomogeneities. The bottom right-hand figure shows a fringe visibility function 601, with zeroth order and first order diffraction patterns. The 50% duty cycle on the grating 203 makes all even orders of the diffraction pattern invisible. At the bottom left of FIG. 6, the image space sharing grating 201 is shown, with a shear ratio of 0.5.

The lateral shearing interferometer 310 interferes a wavefront with itself, or, phrased another way, it interferes a shifted copy of the wavefront with itself. One of the problems with the lateral shearing interferometer 310, such as described above, is the need to use an EUV light source that is available as part of the lithography tool. The characteristics of the EUV source need to be adapted to be suitable for use in the lateral shearing interferometer 310. The characteristics of the EUV source are such that there is a considerable amount of spatial coherence in the region of illumination. The high degree of spatial coherence means that given two distinct points on an illuminated surface, the phase relationship between them stays stable over time. A measure of spatial coherence is the maximum distance between the two points that have a stable phase relationship between them. In this case, the region that is illuminated by the EUV source includes an object plane (or source module grating 203), which consists of parallel rulings. Each ruling has random variation in its height, or a certain degree of "roughness".

When used in shearing interferometers such as described above, the presence of a high degree of spatial coherence, combined with the randomized height of the rulings of the source module grating 203, results in a high degree of speckle. Speckle can cause problems because instead of having a uniform illumination field, the illumination field has "pock mark" regions of higher and lower intensity in the far field, where the interferometry is actually done.

The source module grating 203 is a one dimensional grating. Each ruling of the source module grating 203, therefore, has a roughness pattern, such that each ruling by itself becomes a "scatterer" of the EUV radiation. The scattering features of each ruling have dimensions on the order of about 100 nanometers.

The solution to the speckle problem is moving (translating) the source module grating 203, such that the spatial coherence in the far field is broken up, and the speckle is reduced or eliminated. The amount of movement should be substantial compared to the integration time of the electronics and the detector. In one embodiment, a single frame acquisition time is approximately one quarter of a second. In other words, within an integration period of the electronics, one needs to "replace" the entire source module grating 203. This would completely destroy other spatial coherence at the image plane.

The most effective way to move the source module grating 203 is when the source module grating 203 is in a plane that is optically conjugate with the image plane. Furthermore, it is most effective to move the source module grating 203 in a direction parallel to the rulings.

In this case, there is a projection of the pupil of the projections optics 104 onto a camera, which typically includes the CCD array 204. However, the source module grating 203 is not optically conjugate with the CCD array, rather, it is optically conjugate with the sensor module grating 201 in the image plane of the projection optics 104.

Optically conjugate planes mean that a single point in one conjugate plane corresponds to a single point in the other conjugate plane. For example, a single point in the object plane corresponds to a single point in the image plane.

Similarly, a single point in the pupil plane corresponds to a single point in the CCD detector plane. In the present invention, spatial coherence is eliminated in the CCD detector plane, rather than only in the image plane.

There is a Fourier transform relationship between the amplitude in the object plane and the amplitude in pupil plane. In other words, they are effectively Fourier transform pairs. Given the properties of Fourier transforms, translating an object in one domain does not translate it in the other domain, but instead, introduces a phase shift in the other domain. Therefore, translating the source module grating 203 only a small amount in the object plane does not sufficiently remove speckle in the image plane. the result is a phase shift in the image plane, which is insufficient to eliminate the spatial coherence. A phase shift in the image plane does not show up, substantially, in the intensity distribution.

The source module grating 203 is preferably translated only parallel to the rulings, because translating the source module grating 203 in some other direction would affect the quality of the interference fringes (see FIG. 6). Note that because of the nature of the randomized surface of the source module grating 203, it is impossible to tell direction in which the randomized surface of the source module grating 203 is being translated. This property of the source module grating 203 is referred to as isotropy. Thus, by translating the source module grating 203 parallel to the rulings, as far as the scattering effect is concerned, the effect is the same as if the source module grating 203 were being translated perpendicular to the rulings.

Another way to think of this is to consider that the source module grating 203 as having two separate portions—one portion is the rulings, which have no randomized structure to them, and another part is the randomized structure superimposed over the rulings. The randomized structure portion is isotropic, while translation of the rulings of the grating parallel to a direction to the rulings does not affect the fringes. Thus, with the translation of the source module grating 203 parallel to the rulings, speckle is reduced or eliminated.

As a rough order of magnitude, the source module grating 203 should be translated approximately 20 microns for a 13.5 nanometer source.

As an alternative to the arrangement described above, the object plane source module grating 203 can be separated into two elements, a grating with rulings that have a flat surface, and a separate randomized surface that acts as a scatterer, or a diffuser. These two portions should be positioned close together in the object plane. As an alternative, the two portions can be spaced apart, for example, by positioning the randomized surface portion at another optically conjugate plane closer towards the EUV source. This, obviously, entails the need for potentially more stages, one to translate the object plane grating in and out of position, and another to stage to move the randomized surface portion.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An interferometer system comprising:
   a first grating having a plurality of rulings of randomized height;
   an imaging system that focuses the electromagnetic radiation at the first grating;
   a second grating assembly, wherein the second grating assembly is located further away from a source of the electromagnetic radiation than the first grating assembly;
   an optical system that projects an image of the first grating onto the second grating assembly; and
   a detector that receives a fringe pattern produced by the second grating assembly.

2. An interferometer system comprising:
   a first grating having a plurality of rulings of randomized height;
   an imaging system that focuses electromagnetic radiation at the first grating;
   a second grating assembly, wherein the second grating assembly is located further away from a source of the electromagnetic radiation than the first grating assembly;
   an optical system that projects an image of the first grating onto the second grating assembly; and
   a detector that receives a fringe pattern produced by the second grating assembly,
   wherein the second grating assembly comprises:
      two gratings disposed, respectively, on top of one another, wherein each of the two gratings has a pitch configuration with a checkerboard-like interference pattern.

3. The system of claim 1, wherein the electromagnetic radiation has a wavelength between 13-15 nm.

4. The system of claim 1, wherein the electromagnetic radiation is Extreme Ultraviolet (EUV) radiation.

5. The system of claim 1, wherein the detector is optically conjugate with a pupil of the imaging system.

6. The system of claim 1, wherein the first grating is a reflective grating.

7. A method of measuring a wavefront of an optical system comprising:

directing electromagnetic radiation to a first grating having a plurality of rulings of randomized heights;

optically conjugating the first grating with an image plane;

receiving reflected radiation from the first grating at a second grating located at the image plane while simultaneously moving the first grating parallel to the rulings; and determining wavefront parameters from the image.

8. The method of claim 7, wherein the electromagnetic radiation has a wavelength between 13-15 nm.

9. The method of claim 7, wherein the electromagnetic radiation is Extreme Ultraviolet (EUV) radiation.

* * * * *